(12) United States Patent
Turovets

(10) Patent No.: US 11,335,612 B2
(45) Date of Patent: May 17, 2022

(54) APPARATUS AND METHOD FOR ELECTRICAL TEST PREDICTION

(71) Applicant: NOVA LTD., Rehovot (IL)

(72) Inventor: Igor Turovets, Moshav Giv'at Ye'arim (IL)

(73) Assignee: NOVA LTD, Rehovot (IL)

(*) Notice: Subject to any disclaimer, the term of this patent is extended or adjusted under 35 U.S.C. 154(b) by 154 days.

(21) Appl. No.: 16/488,967

(22) PCT Filed: Feb. 27, 2018

(86) PCT No.: PCT/IL2018/050221
§ 371 (c)(1),
(2) Date: Aug. 27, 2019

(87) PCT Pub. No.: WO2018/154588
PCT Pub. Date: Aug. 30, 2018

(65) Prior Publication Data
US 2020/0006165 A1    Jan. 2, 2020

Related U.S. Application Data

(60) Provisional application No. 62/463,761, filed on Feb. 27, 2017.

(51) Int. Cl.
*H01L 21/66* (2006.01)
*G01B 11/06* (2006.01)
(Continued)

(52) U.S. Cl.
CPC .............. *H01L 22/34* (2013.01); *G01B 11/06* (2013.01); *G01B 11/26* (2013.01); *G01N 21/47* (2013.01);
(Continued)

(58) Field of Classification Search
CPC ........ G01B 1/00; G01B 2210/00; G06T 1/00; G06T 2200/00; G06F 1/00; G01R 1/00
See application file for complete search history.

(56) References Cited

U.S. PATENT DOCUMENTS 6,791,697 B1   9/2004  Nariman
7,659,126 B1   2/2010  Smith et al.
(Continued)

OTHER PUBLICATIONS

Sendelbach et al.: "Predicting electrical measurements by applying scatterometry to complex spacer structures", Metrology, Inspection, and Process Control for Microlithography XXI. vol. 6518. International Society for Optics and Photonics, vol. 6518, Dec. 31, 2007 (Dec. 31, 2007), XP055536610.

*Primary Examiner* — Jermele M Hollington
*Assistant Examiner* — Temilade S Rhodes-Vivour
(74) *Attorney, Agent, or Firm* — Alphapatent Associates, Ltd; Daniel J. Swirsky

(57) ABSTRACT

A test site and method are herein disclosed for predicting E-test structure (in-die structure) and/or device performance. The test site comprises an E-test structure and OCD-compatible multiple structures in the vicinity of the E-test structure to allow optical scatterometry (OCD) measurements. The OCD-compatible multiple structures are modified by at least one modification technique selected from (a) multiplication type modification technique, (b) dummification type modification technique, (c) special Target design type modification technique, and (d) at least one combination of (a), (b) and (c) for having a performance equivalent to the performance of the E-test structure.

20 Claims, 6 Drawing Sheets

(51) Int. Cl.
*G01B 11/26* (2006.01)
*G01N 21/47* (2006.01)
*G01R 31/28* (2006.01)
*G11C 29/38* (2006.01)

(52) U.S. Cl.
CPC .......... *G01R 31/2884* (2013.01); *G11C 29/38* (2013.01); *H01L 22/12* (2013.01); *H01L 22/14* (2013.01)

(56) References Cited

U.S. PATENT DOCUMENTS

| | | | |
|---|---|---|---|
| 2004/0040001 A1 | 2/2004 | Miller et al. | |
| 2006/0255825 A1* | 11/2006 | Smayling | H01L 21/67253 324/762.02 |
| 2007/0109003 A1* | 5/2007 | Shi | H01L 22/34 324/750.3 |
| 2008/0018026 A1* | 1/2008 | Gregg | B29C 48/475 264/519 |
| 2008/0169539 A1* | 7/2008 | Fang | H01L 24/05 257/676 |
| 2011/0027919 A1* | 2/2011 | Wack | G01B 11/245 438/16 |
| 2013/0208973 A1* | 8/2013 | Brill | G06T 7/80 382/145 |
| 2014/0282302 A1* | 9/2014 | Greiner | G06F 30/30 716/54 |
| 2015/0171015 A1* | 6/2015 | Mahajan | H01L 21/568 257/712 |
| 2016/0069792 A1* | 3/2016 | O'Mullane | G01N 21/956 356/364 |

\* cited by examiner

Figure 1:
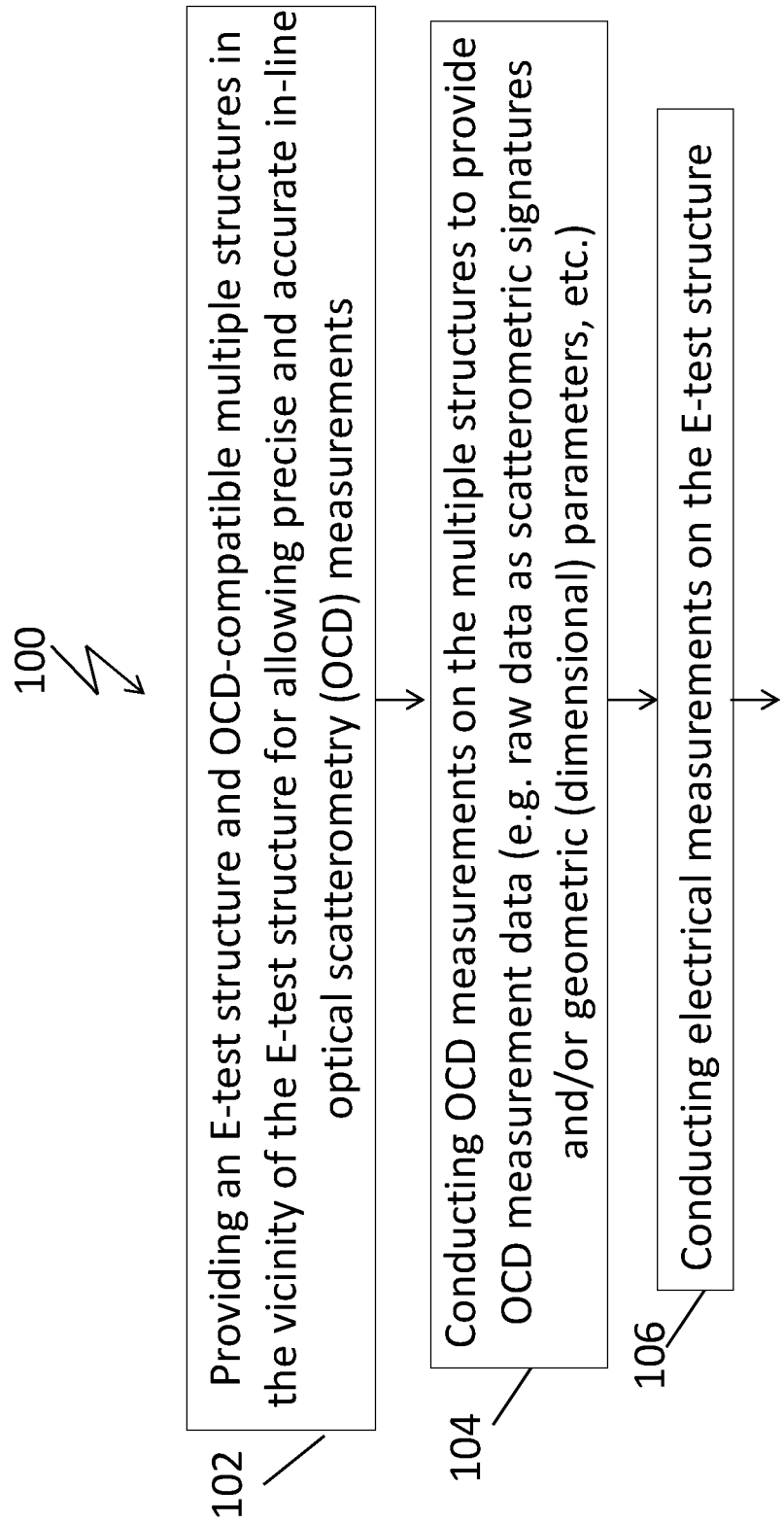

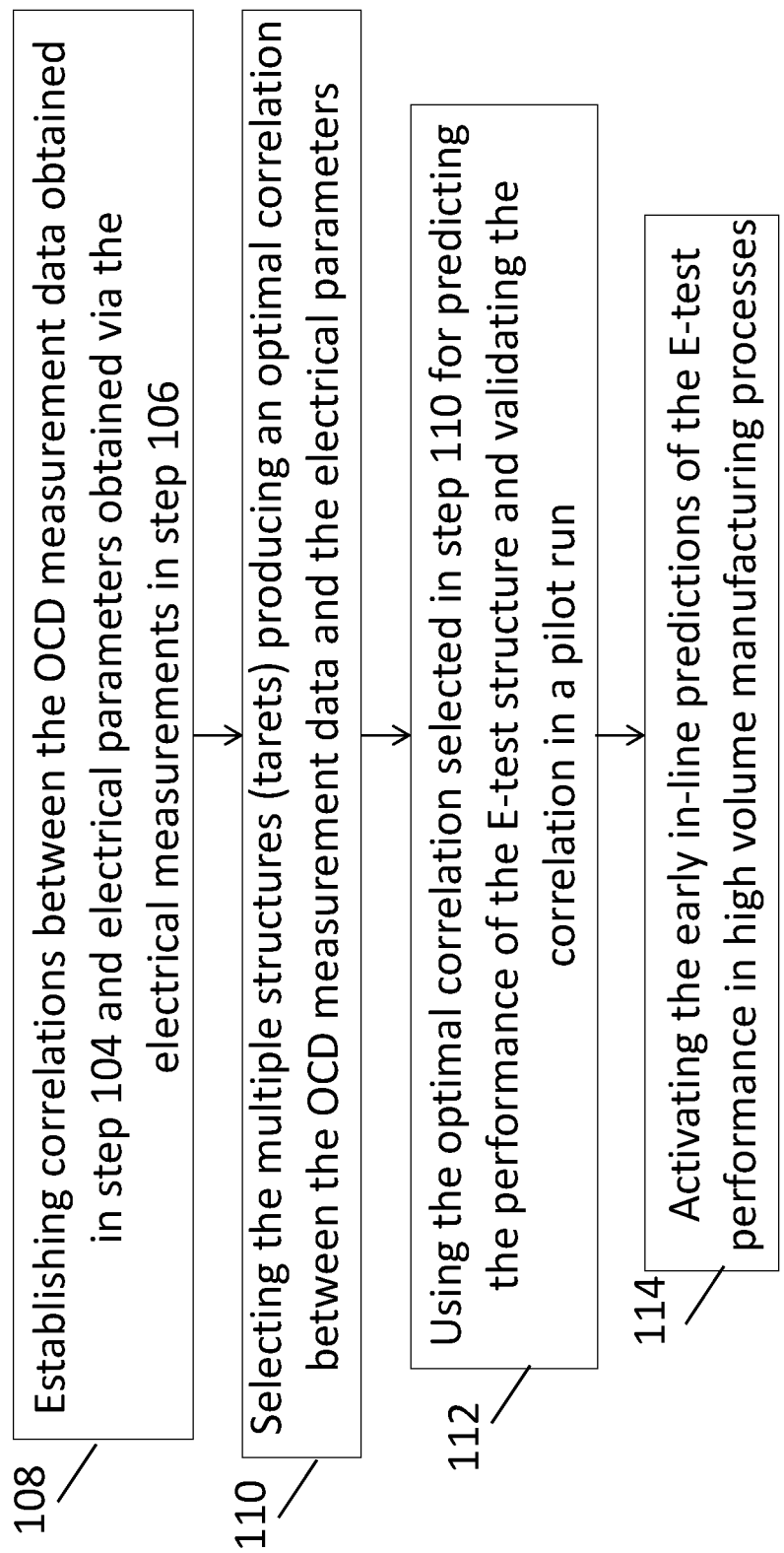
Fig. 1 (continue)

page 1

APPARATUS AND METHOD FOR ELECTRICAL TEST PREDICTION

CROSS-REFERENCE TO RELATED APPLICATIONS

This application is a U.S. National Phase Application under 35 U.S.C. 371 of International Application No. PCT/IL2018/050221, which has an international filing date of Feb. 27, 2018, and which claims the benefit of priority from U.S. Provisional Patent Application No. 62/463,761, filed Feb. 27, 2017, the disclosure of which is incorporated herein by reference in its entirety.

FIELD OF THE INVENTION

The present invention relates to IC fabrication processes. More specifically, the present invention relates to process control in IC fabrication processes.

BACKGROUND

The continuing scale-down of IC device dimensions lead to a continuous increase in integrated circuit device density, increase in functional complexity, and a relatively long multi-step manufacturing process.

Due to the relatively long manufacturing process of the IC devices, and since the electrical performance readout (test) is conducted at relatively late stages of the process, predicting the electrical performance of the device at an early stage of the manufacturing process via in-line measurements may be highly useful in enabling altering/improving the manufacturing process.

Recently there have been numerous attempts to use in-line measurements on existing E-test structures to have early prediction of E-test performance. Some approaches include rigorous modelling of all geometrical parameters of E-test structure features.

Rana N. et al., "Machine Learning and Predictive Data Analytics Enabling Metrology and Process Control in IC Fabrication", Proc. Of SPIE, Vol. 9424, provide a general overview of machine learning and advanced analytics application in the advanced semiconductor development and manufacturing, and Breton M., et al, "Electrical Test Prediction Using Hybrid Metrology and Machine Learning", Proc. Of SPIE, Vol 10145, demonstrate improvement in ILT prediction capability by (a) incorporating fast reference-based machine learning on non-OCD-compatible test structures, and (b) combining OCD with XRF technology (hybrid metrology).

SUMMARY OF THE INVENTION

The goal of the present invention is to provide an accurate method for predicting the electrical performance of IC devices at early stages of the manufacturing process via an optical metrology such as scatterometry (OCD). For this purpose, optical measurements are required on E-test structures or similar structures.

Currently, the use of scatterometry (OCD) for measurements on the front-end (FE) E-test structures, at early stages of the manufacturing process, is not possible as FE E-test structures are usually not "scatterometry friendly".

In order to conduct OCD measurements, such FE E-test structures should be modified to have the following characteristics:

(a) an area that is either same as or larger than the area on which scatterometry measurements are to be performed, i.e., same as or larger than the spot size of the beam, at the relevant in-line process steps; and
(b) an improved sensitivity to target parameter/s at the relevant in-line process steps to be monitored.

In accordance with some embodiments of the present invention, there is thus provided a method for predicting E-test structure (in-die structure) and/or device performance comprising:
(i) providing an E-test structure and OCD-compatible multiple structures in the vicinity of said E-test structure to allow optical scatterometry (OCD) measurements;
(ii) conducting optical scatterometric (OCD) measurements on said multiple structures;
(iii) conducting electrical measurements on said E-test structure;
(iv) establishing correlations between an OCD measurement data obtainable via said OCD measurements on said multiple structures and electrical parameters obtainable via said electrical measurements on said E-test structure; and
(v) using said correlations for predicting the performance of said E-test structure.

In accordance with some embodiments of the present invention, the method comprising modifying the OCD-compatible multiple structures in the vicinity of said E-test structure by applying at least one modification technique selected from:
(a) multiplication type modification technique;
(b) dummification type modification technique;
(c) special Target design type modification technique; and
(d) at least one combination of (a), (b) and (c).

In accordance with some embodiments of the present invention, modifying said OCD-compatible multiple structures by said multiplication type modification technique comprising creating multiple structures identical to and in the vicinity of said E-test structure.

In accordance with some embodiments of the present invention, modifying said OCD-compatible multiple structures by said dummification type modification technique comprising adding dummy structures in the vicinity of said E-test structure.

In accordance with some embodiments of the present invention, modifying said OCD-compatible multiple structures by said special target design type modification technique comprising modifying the layout of said E-test structure and/or the layout of said multiple structures in the vicinity of said E-test structure according to design rules limits and/or process limitations, and/or patterning limitations.

In accordance with some embodiments of the present invention, modifying said OCD-compatible multiple structures comprising applying at least one combination of said modification techniques.

In accordance with some embodiments of the present invention, the method comprising selecting the multiple structures (targets) producing an optimal correlation between said electrical/geometrical parameters obtainable via OCD measurements on said multiple structures and said electrical parameters obtainable via said electrical measurements on said E-test structure.

In accordance with some embodiments of the present invention, the method comprising validating said optimal correlation in a pilot run.

In accordance with some embodiments of the present invention, the method comprising activating early in-line predictions of said device performance in a production process using said optimal correlation and said optical scatterometry (OCD) measurements performed on said OCD-compatible multiple structures during HVM.

In accordance with some embodiments of the present invention, the method comprising activating said optimal correlation in high volume manufacturing processes.

In accordance with some embodiments of the present invention, the method comprising providing said E-test structure and said OCD-compatible multiple structures on at least one layer of said device for predicting said E-test structure (in-die structure) and/or said device performance.

In accordance with some embodiments of the present invention, the method comprising locating said E-test structure either inside the area of said multiple structures on which scatterometry (OCD) measurements are conductible or on the periphery of said area.

In accordance with some embodiments of the present invention, the method comprising creating at least one additional E-test structure to ensure that the performance of said multiple structures is equivalent to the performance of said E-test structure.

In accordance with some embodiments of the present invention, the method comprising applying said method to logic in-die "quasi-repeatable" structures.

In accordance with some embodiments of the present invention, the method comprising applying said method to a complex in-die memory structure selected from DRAM, cross point, VNAND, MRAM and the like.

In accordance with some embodiments of the present invention, there is also provided a test site for predicting E-test structure (in-die structure) and/or device performance comprising an E-test structure and OCD-compatible multiple structures in the vicinity of said E-test structure to allow optical scatterometry (OCD) measurements, said OCD-compatible multiple structures modified by at least one modification technique selected from:
  (a) multiplication type modification technique;
  (b) dummification type modification technique;
  (c) special Target design type modification technique; and
  (d) at least one combination of (a), (b) and (c); for having a performance equivalent to the performance of said E-test structure.

In accordance with some embodiments of the present invention, the E-test structure located either inside the area of said multiple structures on which scatterometry (OCD) measurements are conducted or on the periphery of said area.

In accordance with some embodiments of the present invention, the test site comprising at least one additional E-test structure created to ensure that the performance of said multiple structures is equivalent to the performance of said E-test structure.

In accordance with some embodiments of the present invention, the OCD-compatible multiple structures modified via said multiplication type modification to comprise multiple structures identical to and in the vicinity of said E-test structure.

In accordance with some embodiments of the present invention, the OCD-compatible multiple structures modified via said dummification type modification technique to comprise dummy structures in the vicinity of said E-test structure.

In accordance with some embodiments of the present invention, the OCD-compatible multiple structures modified via said special target design type modification technique to comprise a layout of said E-test structure and/or a layout of said multiple structures modified according to design rules limits and/or process limitations, and/or patterning limitations.

In accordance with some embodiments of the present invention, the OCD-compatible multiple structures modified via at least one combination of modification techniques selected from multiplication type modification technique, dummification type modification technique and special target design type modification technique.

In accordance with some embodiments of the present invention, the test site is provided on at least one layer of said device.

DETAILED DESCRIPTION OF THE EMBODIMENTS

In accordance with some embodiments of the present invention, there are provided a method and a test site for advanced process control of semiconductor manufacturing and early prediction of electrical performance and reliability of transistors.

FIG. 1 illustrates a method 100 for predicting E-test structure and/or device performance in accordance with some embodiments of the present invention.

Method 100 comprising the following steps:

Step (102)—providing an E-test structure and OCD-compatible multiple structures in the vicinity of the E-test structure for allowing precise and accurate in-line optical scatterometry (OCD) measurements;

Step (104)—conducting OCD measurements on the multiple structures to provide OCD measurement data (e.g. raw data as scatterometric signatures and/or geometric (dimensional) parameters, etc.);

Step (106)—conducting electrical measurements on said E-test structure;

Step (108)—establishing correlations between the OCD measurement data obtained in step 104 and electrical parameters obtained via the electrical measurements in step 106;

Step (110)—selecting the multiple structures (targets) producing an optimal correlation between the OCD measurement data and the electrical parameters;

Step (112)—using the optimal correlation selected in step 110 for predicting the performance of said E-test structure and validating the correlation in a pilot run; and Step (114)—activating the early in-line predictions of the E-test performance in high volume manufacturing processes.

In accordance with some embodiments of the present invention, activating the early in-line prediction of the E-test performance in a production process uses optical scatterometry (OCD) measurements performed on OCD-compatible multiple structures during HVM and the optimal correlation selected in step 110.

In accordance with some embodiments of the present invention, modifying the OCD-compatible multiple structures in the vicinity of an E-test site (FEOL and/or BEOL) is based on the following rules:
  (a) Modification of the vicinity of the E-test structure should not alter the performance and the reliability of the E-test structure;
  (b) Modification of the vicinity of the E-test structure should be applied for the creation of additional test sites for optical in-line metrology that will "mimic" the performance of the E-test structure;

(c) the vicinity of each E-test structure should be modified for optimal OCD metrology performance and best possible correlation to the E-test performance; and (d) Modification of the E-test vicinity should allow OCD metrology with full geometrical/material modelling and/or with partial modelling of features of interest and/or with one of the modeless approaches based on machine learning and/or neural net algorithms.

In accordance with some embodiments of the present invention, modifying the OCD-compatible multiple structures in the vicinity of an E-test site (FEOL and/or BEOL) is carried out by applying at least one modification technique selected from:

(a) "Multiplication"
(b) "Dummification"
(c) "Special Target design"
(d) All possible combinations of the above (a) "Multiplication" type modification—multiple identical E-test structures are created around the original E-test structure to form a "repeatable E-test array" for allowing OCD measurements.

In this case, the additional structures may have a layout identical to the layout of the E-test structure and may be processed by same manufacturing procedure. The additional structures, however, may not go through electrical measurements but rather through OCD measurements.

Figures 2A, 2B:
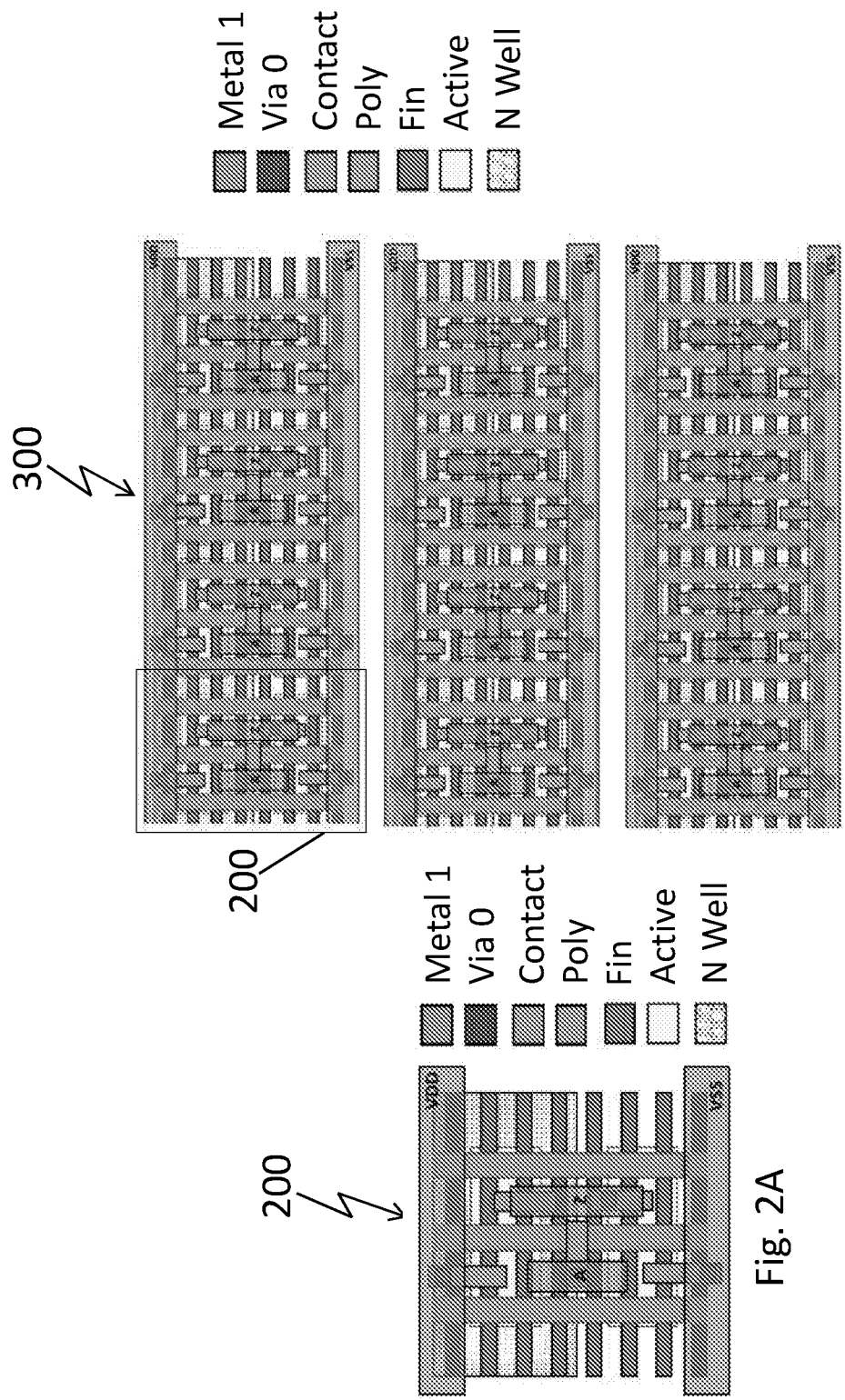

FIG. 2A illustrates NMOS DUT type E-test structure 200, and FIG. 2B illustrates a repeatable array of NMUS DUT type E-test structures 300 created by "multiplication" type modification, i.e., via multiple repetitions of the NMUS DUT type E-test structure 200.

In accordance with some embodiments of the present invention, the size of E-test structure 200 may be greater than 10 by 10 microns.

(b) "Dummification" type modification—dummy structures are added in the vicinity of an E-test structure to cover an area suitable for OCD measurements.

In this case, the dummy structures have a layout similar to that of the E-test structure and are processed by same manufacturing procedure.

Figure 3A:
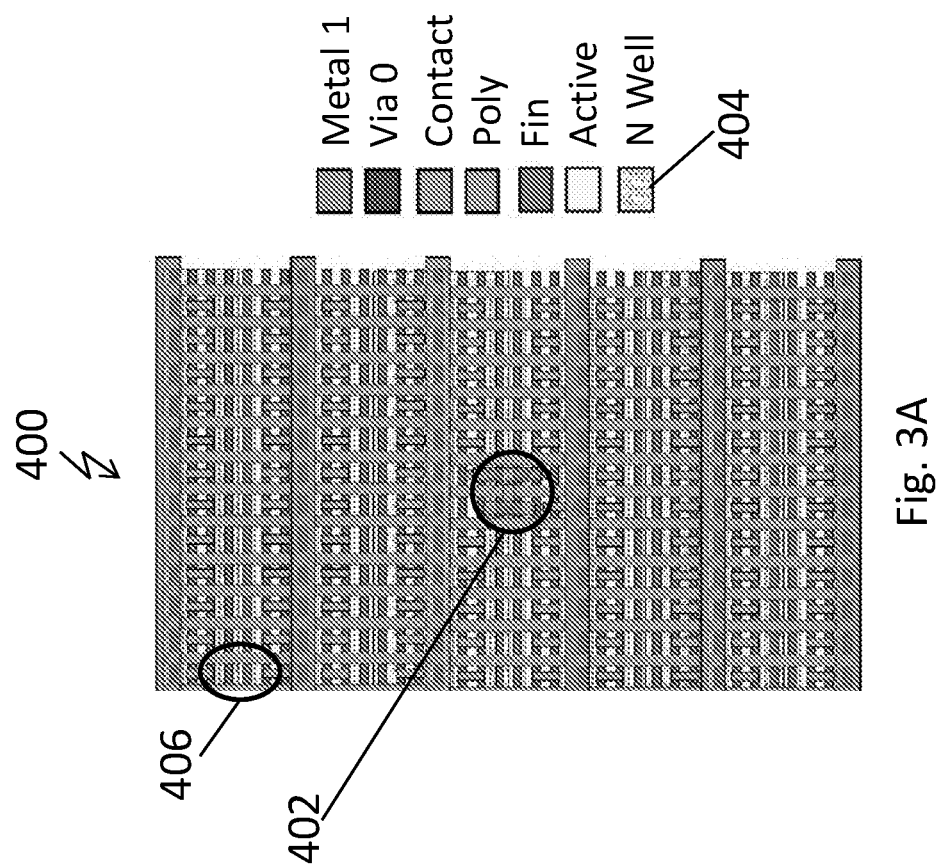

FIG. 3A illustrates an array 400 of dummy structures around an E-test structure 402 in accordance with some embodiments of the present invention. Array 400 is created by "dummification" type modification, i.e., via adding dummy structures, such as structure 406 around E-test structure 402.

In accordance with some embodiments of the present invention, the size of E-test structure 402 may be greater than 10 by 10 microns.

It should be noted that in case of "Dummification" type modification, the surroundings of E-test structure 402 may be slightly modified to allow a "scatterometry friendly" layout and improvement of sensitivity to target parameters such as lines CD's, SWA (Side Wall Angle) etc.

In accordance with some embodiments of the present invention, a simplified "scatterometry friendly" layout in the vicinity of an E-test structure may be essential to (a) reduce geometrical complexities of the E-test structure, and/or (b) simplify a relatively complex 3D structure, and/or (c) modify a 3D layout in certain layers to a 2D layout.

Figure 3B:
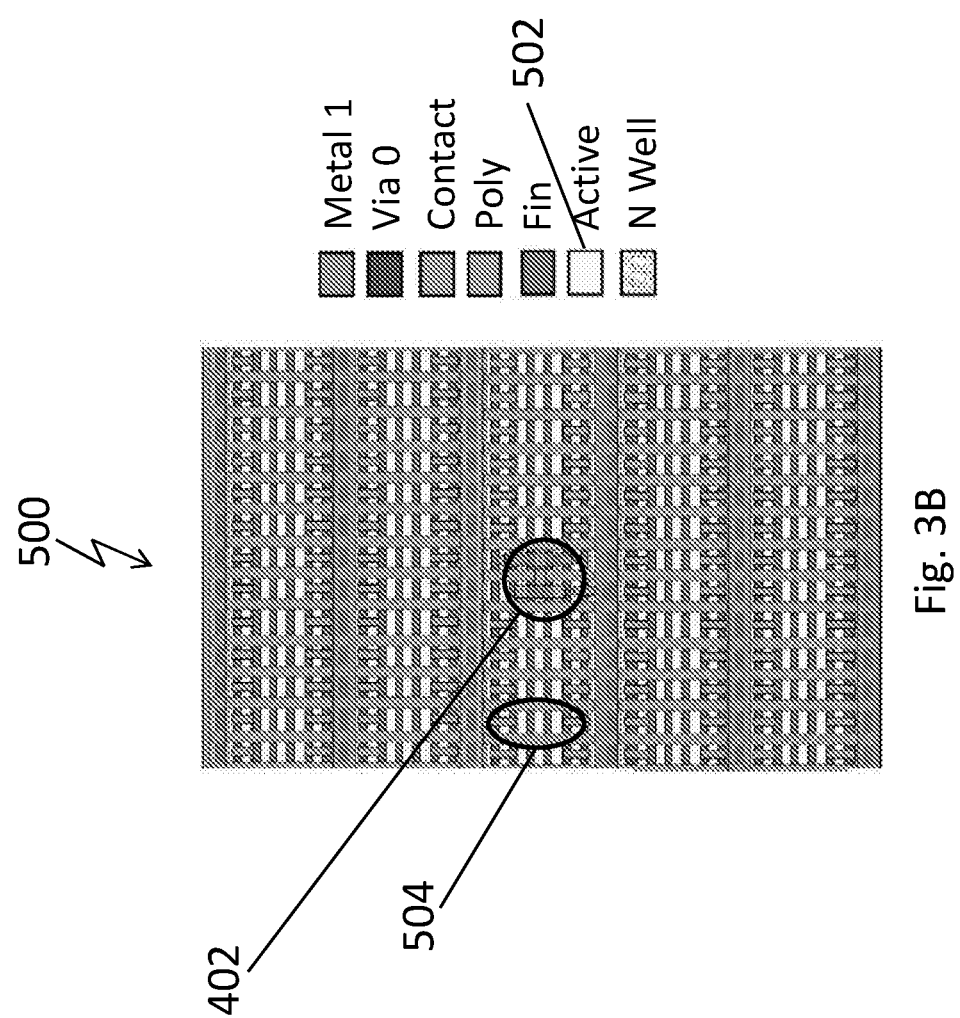

FIG. 3B is a NMOS DUT "scatterometry friendly" array 500 of dummy structures around E-test structure 402 in accordance with some embodiments of the present invention. Array 500 is created by modifying the dummy structures of FIG. 3A into simplified structures such as structure 504 around E-test structure 402. More specifically, the Nwell areas 404 of the dummy structures seen in FIG. 3A are transformed into active areas 502 seen in FIG. 3B.

In accordance with some embodiments of the present invention, the total size of E-test structure 402 is more than 10 by 10 microns.

(c) "Special target design" type modification—may be performed on an E-test structure to increase the performance of the E-test structure and/or on multiple structures around the E-test structure within the limits of the design rules and/or process limitations, and/or patterning limitations.

Figure 4:
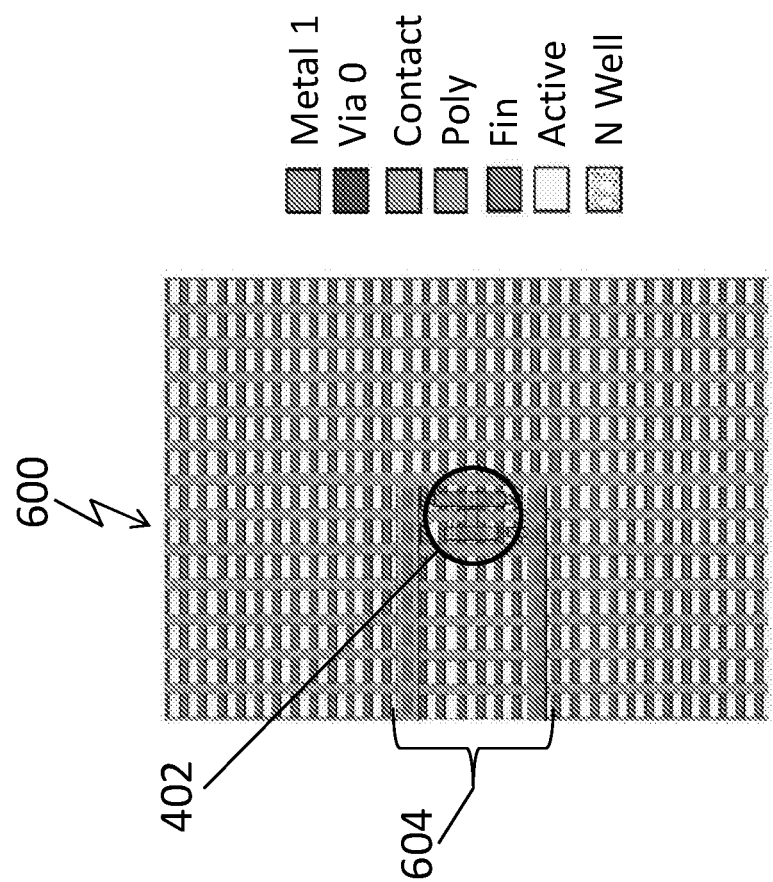

FIG. 4. is a NMOS DUT array 600 where structures 604 in the vicinity of NMOS DUT E-test site 402 are modified by "Special target design" type modification into a simple layout of active/fins/poly 2D design in accordance with some embodiments of the present invention.

The layout of some of the structures, e.g., structures 604, around NMOS DUT E-test site 402 as seen in FIG. 3B is modified to exclude contacts and metal lines in the vicinity of E-test structure 402. Such modification may enable relatively high sensitivity to Gate and Fin parameters at certain process steps (for instance, after Self Aligned Contacts (SAC)). However, such modification may not affect the electrical performance and reliability of the E-test structure.

As described in Nova Measuring Instruments Ltd.'s PCT Publication No. 2015193904, there are unlimited possibilities of using the "special target design" type modification for creating asymmetrical targets for dark field optical measurements that mimic in-die or E-test performance while improving in-line sensitivity to parameters of interest at certain process steps.

(d) Various combinations of modification types listed in (a)-(c)—various different combinations of the above-mentioned modification types may be applied to each process step along the manufacturing process. For instance, "Special target design" type modification may be applied at the fin level and may include a 2D design of the Fins, "multiplication" type modification may be applied at the SAC level, and minor layout modification may be applied at the poly level to provide smaller periodicity. According to some embodiments of the present invention, certain combinations of the above-described modification techniques may allow "SRAM-like" structures containing only PFETs, or only NFETS, or "SRAM-like" structures that are fully or partially missing certain steps of S/D processing, such as EPI layers (SiGe, and others), and/or Wells, and/or implants, etc.

In accordance with some embodiments of the present invention, the E-test structure may be located either inside the "scatterometry friendly" area or on its periphery.

In order to choose an optimal modification technique, and in order to ensure that the performance of the multiple structures is equivalent to the performance of the E-test structure, additional E-test structures should be created in the vicinity of the E-test structure.

E-test structures should have relatively large pads with a relatively large separating distance in between the pads for enabling contacting the metal layer (Ml or Mx) for electrical measurements, and for enabling the modification of the layout around the E-test structure for successful optical measurements on all FEOL operations.

It should be noted that modification of the vicinity of an E-test structure may be performed on at least one layer of the manufactured structure, i.e., on at least one layer that may/may not be related to the measurements intended to be carried out at the E-test structure.

It should be further noted that the modification of an E-test structure into a "scatterometry friendly" structure may minimize the effect of previous processing steps on the scatterometry (OCD) results, i.e., the results may reflect the characteristics of the E-test structure with respect to a specific process step after which measurements are conducted.

In accordance with some embodiments of the present invention, the above modification techniques may be based on SW simulations which include metrology considerations of sensitivity and correlations of target parameters, as well as design rule compliance and manufacturability.

In accordance with some embodiments of the present invention, the above-mentioned methodology may be applied to various complex in-die memory structures, such as DRAM, cross point, VNAND, MRAM and other memories and to other logic in-die "quasi-repeatable" structures.

In accordance with some embodiments of the present invention, in-line scatterometry (OCD) may include the following methods: angular and spectroscopic reflectometry, elipsometry and/or scatterometry, bright field or dark field, and/or similar methods using Extended IR (EIR), Deep UV (DUV), Vacuum UV (VUV) and X-rays, and/or combination of all above.

The invention claimed is:

1. A method for predicting E-test structure (in-die structure) performance, comprising:
   providing a semiconductor device having an E-test structure at a first location in the device and multiple structures at one or more other locations in the device, where the other locations are in the vicinity of said E-test structure, and where the multiple structures are configured based on the E-test structure;
   (ii) conducting optical scatterometric (OCD) measurements on said multiple structures;
   (iii) conducting electrical measurements on said E-test structure;
   (iv) establishing correlations between any OCD measurement data obtainable via said OCD measurements on said multiple structures and any electrical parameters obtainable via said electrical measurements on said E-test structure; and
   (v) using said correlations for predicting the performance of said E-test structure.

2. The method of claim 1 wherein said multiple structures are modifications of said E-test structure by applying one or more of
   (a) multiplication
   (b) dummification and
   (c) special Target design type modification of said E-test structure.

3. The method of claim 2, wherein modifying said multiple structures by said multiplication comprises creating multiple structures identical to and in the vicinity of said E-test structure.

4. The method of claim 2, wherein modifying said multiple structures by said dummification comprises adding dummy structures in the vicinity of said E-test structure.

5. The method of claim 2, wherein modifying said multiple structures by said special target design type modification comprises modifying the layout of said E-test structure and/or the layout of said multiple structures in the vicinity of said E-test structure according to design rules limits and/or process limitations, and/or patterning limitations.

6. The method of claim 1, comprising selecting the multiple structures producing an optimal correlation between said OCD measurement data and said electrical parameters.

7. The method of claim 6, comprising validating said optimal correlation in a pilot run.

8. The method of claim 6, comprising activating early in-line predictions of said device performance in a production process using said optimal correlation and said optical scatterometry (OCD) measurements performed on said multiple structures during high-volume manufacturing.

9. The method of claim 1, comprising providing said E-test structure and said multiple structures on at least one layer of said device for predicting said E-test structure performance.

10. The method of claim 1, comprising locating said E-test structure either inside the area of said multiple structures on which scatterometry (OCD) measurements are conductible or on the periphery of said area.

11. The method of claim 1, comprising creating at least one additional E-test structure to ensure that the performance of said multiple structures is equivalent to the performance of said E-test structure.

12. The method of claim 1, comprising applying said method to logic in-die "quasi-repeatable" structures.

13. The method of claim 1, comprising applying said method to a complex in-die memory structure selected from DRAM, cross point, VNAND, and MRAM.

14. The test site of claim 1, wherein said test site is provided on at least one layer of said device.

15. A test site on a semiconductor device comprising:
   an E-test structure at a first location on the device; and
   multiple structures at one or more other locations on the device, where the other locations are in the vicinity of said E-test structure, and where the multiple structures are configured based on the E-test structure, wherein said multiple structures are modifications of said E-test structure being modified via any of multiplication, dummification, and special target design type modification of said E-test structure.

16. The test site of claim 15, wherein said E-test structure is located either inside the area of said multiple structures on which scatterometry (OCD) measurements are conducted or on the periphery of said area.

17. The test site of claim 15, including at least one additional E-test structure created to ensure that the performance of said multiple structures is equivalent to the performance of said E-test structure.

18. The test site of claim 15, wherein said multiple structures are modified via said multiplication to comprise multiple structures identical to and in the vicinity of said E-test structure.

19. The test site of claim 15, wherein said multiple structures are modified via said dummification to comprise dummy structures in the vicinity of said E-test structure.

20. The test site of claim 15, wherein said multiple structures are modified via said special target design type modification to comprise a layout of said E-test structure and/or a layout of said multiple structures modified according to design rules limits and/or process limitations, and/or patterning limitations.

* * * * *